United States Patent [19]

Stevens

[11] 4,144,490
[45] Mar. 13, 1979

[54] ELECTRONIC SENSING AND MEASURING APPARATUS FOR SIGNALS IN AUDIO FREQUENCY RANGE

[75] Inventor: Harold E. Stevens, Lyndhurst, Ohio
[73] Assignee: Music Specialities Corp., Rocky River, Ohio
[21] Appl. No.: 734,644
[22] Filed: Oct. 21, 1976
[51] Int. Cl.$^2$ ............................................ G01R 23/02
[52] U.S. Cl. .................................. 324/78 D; 84/1.17
[58] Field of Search ................ 324/78 D, 78 R, 78 Z, 324/79 D, 77 R, 77 B; 84/1.06, 1.16, 1.17

[56] References Cited

U.S. PATENT DOCUMENTS

| | | | |
|---|---|---|---|
| 3,731,196 | 5/1973 | Young | 324/78 D |
| 3,922,943 | 12/1975 | Niiomi | 84/1.17 |

Primary Examiner—M. Tokar
Attorney, Agent, or Firm—Baldwin, Egan, Walling & Fetzer

[57] ABSTRACT

Electronic sensing and measuring equipment for accurately measuring the pitch of musical sounds and which includes an audio tuner responsive to the fundamental frequency of a continuing signal while rejecting all other harmonically related components of said signal to produce a digital signal representing the fundamental pitch of said musical sound, and a counter for counting and totalizing said digital signal defining the same in terms of its frequency and for visually displaying said defined signal.

9 Claims, 3 Drawing Figures

ELECTRONIC SENSING AND MEASURING APPARATUS FOR SIGNALS IN AUDIO FREQUENCY RANGE

BACKGROUND OF THE INVENTION

Numerous methods have been utilized heretofore for tuning musical instruments. These methods have been applied both to the intent of standardizing the basic pitch relationship and also to the more important purpose of establishing the correct pitch relationships between the various notes available from a given musical instrument. Methods have progressed from the definement by ear through the reliance upon the stability of certain musical instruments and musical instrument related devices, such as tuning forks, tuning bars, and the like. Such methods have produced accuracy to a few tenths of a percent, when used by experts.

With the appearance of the digital counter, and direct digital display methods for providing a display therefore, it has become possible to count audio frequencies and far higher frequencies of electrical, single frequency component signals to several parts per million accuracy, utilizing quartz crystal time bases, and to five or six orders of magnitude greater accuracy, using more sophisticated time bases. Measuring musical pitches to a high degree of accuracy has remained a difficult task, because of the complex nature of musical sounds, the fact that sounds produced by musical instruments contain not only a fundamental pitch, but overtones which may range from within an octave to many octaves above the fundamental frequency.

It is the intent of this invention to establish a means of utilizing the presently available technology of digital counters and accurate time bases to provide a means of measuring the pitch of musical sounds to a degree of accuracy approaching the basic accuracy of these devices. In order to accomplish these ends it is necessary to provide a means of measuring the frequency of the fundamental, or predominating component, while rejecting all other harmonically related frequencies in an electrical wave derived from the output of a musical instrument.

The present invention is therefore intended to:

(1) respond to one frequency of a continuing signal, while rejecting any number of harmonically related frequencies which may be present within that signal;

(2) check, cycle to cycle, and allow presentation of a derived count of cycles for a count period if, and only if, the counted wave matches the frequency of the predominant component of the presented musical tone to a phase variation of plus or minus approximately 90 degrees;

(3) provide a means of coordinating an accurate time base to count a signal for an exact period of time and display that count while the successive count is being taken, and as stated above, refuse to display a count, indicating zero, if a single flaw, represented by a single departure of more than approximately 90 degrees, appearing at any time between the predominant frequency of the musical note and the component being counted should occur;

(4) provide a means of converting the output of a musical instrument to a useful form for the above processing;

(5) provide a usable visible display of a cycle count per time period in a usable language such as cycles per second; and (6) include any or all of the above mentioned functions into a practical package, convenient to use, which will accomplish the above described mission.

BRIEF DESCRIPTION OF PREFERRED EMBODIMENT

Figure 2:
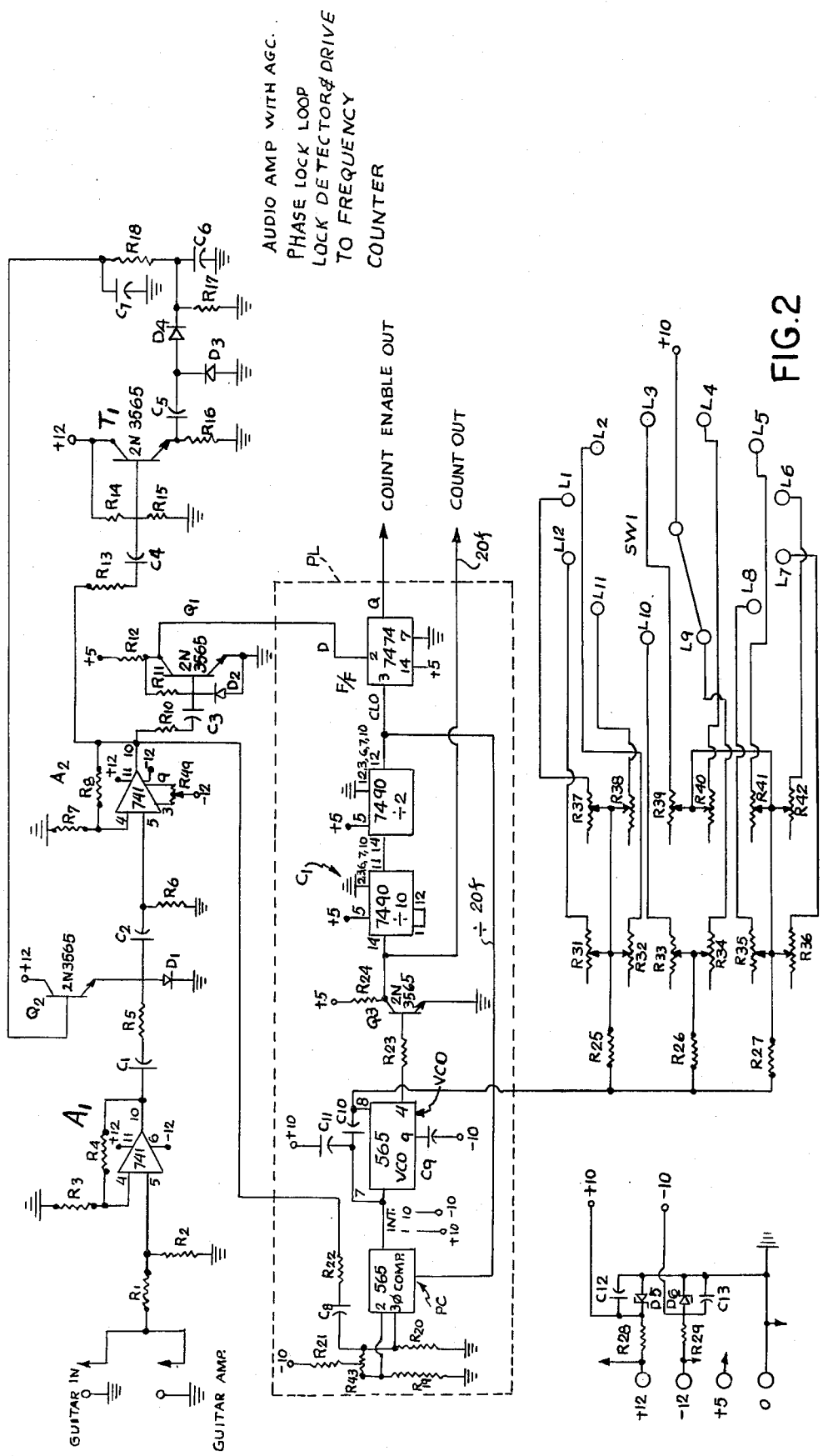
FIG. 2 is a schematic wiring diagram of the audio amplifier phase lock circuitry and frequency selector of the present system.

Referring to FIG. 2 the operation of the present system is briefly summarized as follows:

The incoming signal, which may be the output of a guitar, is applied to input terminals of the system—Guitar In and ground—and amplified in conventional amplifiers identified as $A_1$, $A_2$ and $Q_1$. The amplified signal is then applied to the phase comparator PC of a phase locked loop circuit identified at PL, used in the multiplying mode at a multiplication of 20. The multiplied loop output is a digital signal which is then applied to the counter circuitry FIG. 3, where the count is made on a basis of pulses per unit time and displayed by a four digit display. The crystal time base, the coordinating logic circuitry, the counters, the quad latches which take the count and hold it until instructed to take a new count, and the displays all appear in the circuitry of FIG. 3, whereas the power supply which powers all circuitry appears in FIG. 1.

Referring to FIG. 2, the musical instrument such as a guitar is plugged into the input jack—Guitar In—thus applying the input signal from the guitar to the tuner input. The guitar may be tuned as such, or if it is also desired to keep the guitar in a connection for playing through its amplifier, the amplifier may be plugged into the amplifier jack as identified at Guitar Amp., and the guitar amplifier system will be tied together for playing, and the guitar tuned whenever desired, because the amplifier of the tuner looks like a bridging amplifier to the guitar-tuner system, which is to say it acts as a shunt element having so high a shunt impedance as not to affect the guitar-amplifier system. In either case a single string may be struck on the guitar, after setting the tuner to be responsive to that string, (note selector switch), and tuning is accomplished by noting the digital display of the tuner in cycles, and appropriately adjusting the tuning of that string until a satisfactory reading is achieved on that string. By repeating this operation for each string of the guitar, the entire instrument is tuned. Note that the instrument has six switch settings referred to as $Sw_1$, one for each string, of lead guitar $L_1$–$L_6$, and four settings $L_7$–$L_{10}$ similarly for the four strings of the bass guitar.

It will also be noted that two additional switch positions $L_{11}$, $L_{12}$ are present. These are to facilitate checking fretted or fingered notes in the upper range of the instrument. Each of the individual string positions is broad enough in bandwidth to check fretted notes between the basic string tune pitches, and these two additional higher frequency ranges allow checking the higher fret positions on the higher strings.

When an input from the guitar is present, the first uA 741 amplifier $A_1$ from the input amplifies the signal to a voltage level 1000 times greater than the present at the input. This amplified signal is in turn coupled through capacitors $C_1$ and $C_2$, and resistor $R_5$ to the second amplifier $A_2$. (For the moment we will ignore diode $D_1$ and agree that if it displays a reasonably large shunt resistance to ground, our signal will successfully pass.) The second uA 741 amplifier $A_2$ provides an additional 300 times voltage gain. This output of the second uA 741 is used in three instances: (1) Said signal output is divided or attenuated by ten, in amplitude, and applied to the signal input of the phase comparator PC of the phase lock loop circuit. Said circuit is commercially available and may be a Model 565 Phase Locked Loop made by Signetics. (2) Said signal drives a 2N3565 transistor amplifier $Q_1$ to provide an interface to a flip/flop circuit F/F driving the D input of said flip-flop which may be a Model 7474 clocked D flip-flop made by Fairchild. This flip-flop, as hereinafter referred to, is the "check circuit" herein. (3) Said signal drives a 2N3565 transistor $T_1$ to the right of the second uA 741, coupled by $R_{13}$ and $C_4$.

First, with reference to the 2N3565 transistor $T_1$ to the right of the second uA741, coupled by $R_{13}$ and $C_4$. The amplified signal, further amplified in $T_1$ is rectified by diodes $D_3$ and $D_4$ connected as in a doubler circuit, finally providing a charge on capacitor $C_7$ which is a function of the output of the second uA 741 amplifier $A_2$. As this voltage rises, it causes base-emitter current to flow in the attached 2N3565 $Q_2$, and hence 200 to 300 times this current, as collector-emitter current. This transistor $Q_2$ has a beta of 200 to 300. This current passes through diode $D_1$ to ground. As the forward current through diode $D_1$ rises from zero, the apparent shunt resistance drops greatly from the apparent infinite value at zero current. From this it is immediately apparent that whereas for very small signals a voltage gain of 300,000 is realized, in practice, when the output signal reaches a certain level, as further rise occurs, enormous attenuation of the signal driving the second amplifier $A_2$ occurs, tending to limit gain, or to provide automatic gain control action (AGC).

Referring to the second instance, the signal output path from the second amplifier $A_2$ is reduced to 1/10 its magnitude by attenuator $R_{19-20}$ and $R_{43}$ and applied to the signal input of the phase comparator PC of the phase lock loop circuit. This phase lock loop circuit comprises a phase comparator internally coupled to the voltage controlled oscillator (VCO). In use, Model SE 565 of Signetics as aforesaid has been found to be satisfactory for the instant instrument. The output of this phase comparator PC is internally connected to the input current control terminal which defines frequency of a voltage controlled oscillator (VCO) also present in the phase lock loop package. The VCO is set to idle at a frequency, through the chosen value of capacitor $C_9$, and the resistor selected by the position of selector switch $Sw_1$ as will be understood. The output of the VCO is interfaced to TTL through the action of the 2N3565 transistor $Q_3$ the base of which is driven through current limiting resistor $R_{23}$, divided in frequency by 20, by the two TTL Decode Counters connected as dividers, and connected to provide symmetrical square wave output at a frequency of 1/20 the driven frequency, and this divided signal is applied to the reference input of the phase comparator of the phase lock loop. The TTL dividers are commercially available and may be Model 7499 Decode Counter made by Fairchild.

In use the audio signal from the amplifier chain $A_1$, $A_2$ is applied to input terminal of $\phi$ comparator of SE656 and compared phase relationshipwise with the reference signal impressed upon pin 5 of the comparator. As phase departure between the two is seen the coupling to the VCO will be such as to pull the frequency of VCO in a manner to reduce the phase departure between the reference input signal (pin 5) and the audio signal input.

As a result the output signal at pin 4 of the VCO is square wave and twenty times the frequency of the input audio signal.

This output signal is then applied through transistor amplifier $Q_3$ to the input of the first stage of the multi-stage Decode Counter identified at $C_1$ used in the present instance as dividers.

In the present system, within the phase lock loop circuit, two such counters are used in cascade; the first is divide-by-ten connected and the second or output is divide-by-two connected, this choice having been made to provide a symmetrical wave output which is utilized to drive the reference input of the phase comparator.

This divide-by-twenty function is included within the phase lock loop in order to gain a twenty (20) times multiplication at pin 4 of the VCO output. This is required because ten (10) times frequency is basically required to provide a tenths display on the usual readout and the twenty (20) times frequency is used because a ½ second count period is utilized in the display output.

The transistor amplifier $Q_3$ interfaced between output of VCO and input of first divider of counter $C_1$ provides an input to pin 14 of first divider of C which is proper for this TTL device.

Now if the idle frequency of the VCO of the 565 is close enough to twenty times the frequency applied from the uA 741 amplifier, representing the guitar input signal, the VCO will be pulled to establish a lock of the loop, or a continuous hold of the divided by twenty signal in step with the input signal.

Finally, with reference to the third instance of use of said signal output of amplifiers $A_1$, $A_2$ the "check circuit" is a dual flip-flop commercially available such as Model 7474 made by Fairchild having its D input supplied by the amplified input signal as present at the output of the second amplifier $A_2$ and as interfaced by the transistor $Q_1$. The base of said transistor $Q_1$ is driven through $R_{10}$. The clock input is supplied by the divide-by-twenty dividers. With this circuit if a positive clock edge, or a rise from logic zero to logic one occurs at the clock input while a logic one is on the D input, the Q output will present a logic one. If this condition is present every clock edge, Q will hold a steady state logic one. If ever D should be at logic zero when the clock edge hits, a cycle interval, a logic zero will show at Q and hence show on the count enable output.

The frequency of the output signal of the second divider of $C_1$ is the same frequency as the input signal to be examined.

This output signal is applied to the input (pin 3) of signal check circuit identified at 30. This check circuit comprises a clocked flip-flop. One suitable flip-flop which is adequate for the purpose is the Fairchild TTL 7474 device. In its present use, with a logic 1 applied to pin 2 concurrent with a rising signal edge at pin 3 a logic 1 at terminal Q is produced which will remain through any sequence of logic 1 at pin 2 which is within 90° of quadrature phase relation between the audio input to the phase comparator and reference input to phase comparator.

The signal passing out the count one line is exactly twenty times the frequency of the input signal at the guitar input, so long as the loop is locked.

It is obvious that by selection of division circuit in the loop of the phase lock loop the frequency of the signal output may be selected to accommodate any particular decimal display of the count and/or the count period.

A standing logic one is at the count enable output if and only if a lock is established and held. A single cycle slip in lock will produce a momentary logic zero on the count enable output.

Figure 3:
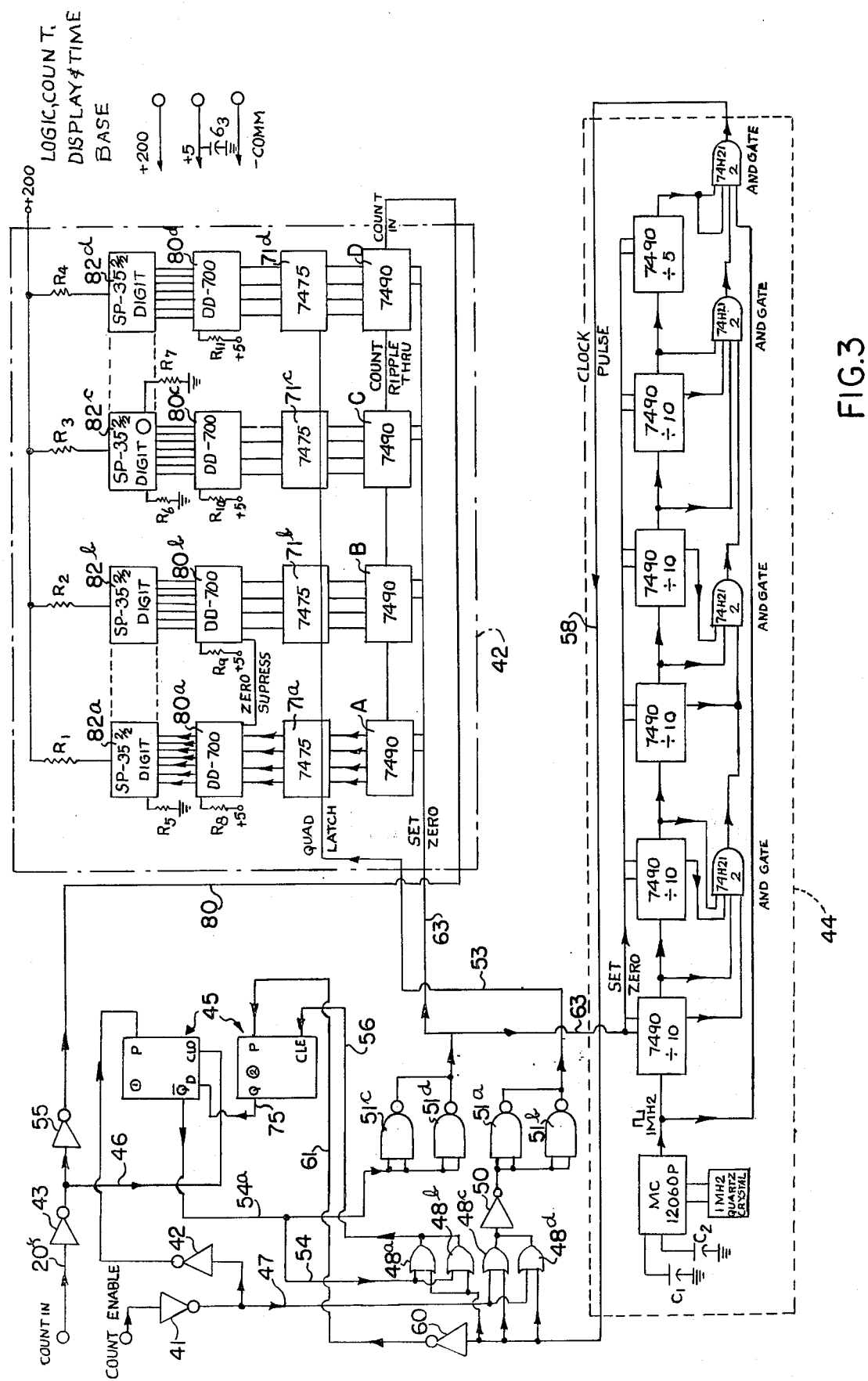
FIG. 3 is a schematic diagram of the counter circuitry of the present system.

With reference to FIG. 3, the logic synchronization circuit is identified in its entirety at 40 and includes a dual D clocked, settable, resettable flip-flop identified at 45 which controls the ability of the counters to count the signal input through their reset inputs.

As seen in FIG. 3, the flip-flops 45 are connected to the count enable terminal through two cascaded inverters 41, 42 which drive the P input terminal of the upper flip-flop, as shown.

In actual use, the cascaded converters 41, 42 may be Model No. 7407 made by Fairchild or equivalent and the connected flip-flops may be Model No. 7474 also made by Fairchild.

These flip-flops are also connected to the "count in" terminal through a similar inverter 43, the output of which is connected by conductor 46 to the clock terminal of the upper flip-flop.

Also included in this circuit 40 are four OR gates 48a–d, the bottom pair as shown 48c, 48d being connected at their inputs in parallel by conductor 47 to the output of inverter 41 connecting to the count enable terminal.

The output of the OR gates 48c, 48d are likewise connected in parallel to each other and to the input of inverter 50 which is similar to inverter 41. The output of inverter 50, in turn, is connected to the inputs of a pair of NAND gates 51a, 51b the outputs of which are also paralelled and connected by conductor 53 to the count and display circuit 42 in a manner to be later described.

The upper pair of OR gates 48a, 48b are connected by conductor 54 to the inverse $\overline{Q}$ terminal of the upper flip-flop, whereas the outputs of said OR gates 48a, 48b are also paralleled and connected by conductor 56 to the clear terminal of the lower flip-flop.

The output clock signal of the clock signal circuit 44 is connected by conductor 58 to the input of inverter 60, the output of which is connected by conductor 61 to the preset (P) terminal of the lower flip-flop.

Conductor 58 also connects individually to one input of each of the four OR gates 48a–d.

A pair of NAND gates 51c, 51d have their inputs paralleled and connected by conductor 54a to the inverse Q terminal of the upper flip-flop 45.

The outputs of the NAND gates 51c, 51d are paralelled and connected by conductor 63 to the 0 reset terminals of all counters included the count and display circuit 42. As also seen in FIG. 3, conductor 63 connects to the 0 reset terminals of all counters and time base dividers in the clock signal circuit 44.

With the synchronization circuit 40 thus described, with a logic one signal on the count enable in terminal, the P terminal of the upper flip-flop 45 will also be at logic one.

The count enable terminal having been low prior to lock will establish a logic zero at P of the upper flip-flop which established a logic zero on Q inverse of said flip-flop. This logic zero will produce through conductor 54c and through the upper pair of NAND gates 51c, 51d a logic one at the output of said gates.

This will cause all counters A–D and time base dividers to lock on zero whereby the counters are reset and clock is stopped.

While Q inverse of the upper flip-flop 45 is low it provided through OR gates 48a, 48b a logic zero on CLE terminal of lower flip-flop 45 producing a logic zero at Q output of the lower flip-flop. This logic zero is applied to D terminal of the upper flip-flop through conductor 75.

Because this terminal D is at logic zero, the next pulse edge of the count in on count in terminal which is connected by conductor 46 to clock terminal of the upper flip-flop 45 will cause Q inverse of said upper flip-flop to go to a logic one.

When Q inverse of said flip-flop goes to logic one a logic zero output is produced at conductor 63, the output of NAND gates 51c, 51d removing zero-reset on the counters and the dividers whereby an accumulation of the count in pulses through count-in conductor 80 is accumulated in the counters A–D.

Another inverter 55 is placed into the conductor 80 between the inverter 43 and the counter inputs (counter D) so that the triggering of the upper flip-flop 45 and counter D will be concurrent, because the particular configuration selected for counter D is one whereby it is triggered by a negative going pulse edge which is typical of such counters, whereas the flip-flop 45 is triggered by the positive going pulse edge.

In use, each of the counters A–D of circuit 42 may be Model TTL/MSI/7490 Decode Counter, capable, as will be understood, of establishing a four-digit binary coded decimal (BCD) output, each of which is connected through a data latch device 71a–71d, one suitable such device being Model TTL/MSI 7475 4-Bit Latch or Four Channel Latch also made by Fiarchild.

As will be understood, each of the data latch devices operates to receive counts from its associated counter A–D to provide a fixed output for a particular interval.

The output of each data latch device is applied to a suitable seven (7)-segment decoder identified as 80a–d. A suitable such decoder is Model DD-700 made by either Sperry or Beckman Instruments. As is known, the function of the seven segment decoder is to translate the four-bit (BCD) output of the 4-Bit Latch device and to provide a suitable drive for a suitable numeric display as identified at 82a–d to visually display a numeral. When this happens, a logic one pulse will strike and quad latch dump line through the lower 2 7437 NAND gates 51a, 51b through the 7404 inverter section 50. At the end of this ½ microsecond pulse the accumulated digital count will be dumped from the 7490s (A–D) FIG. 3 through the 7475 latches and hold on the DD-700 seven segment decoders, which will in turn cause the correct bars in the SP-352 displays to light, so as to display these four digits. It is to be remembered that the incoming signal at "count in" runs twenty times the frequency of the musical note being counted, and since the clock pulse occurs every ½ second, the display will show precisely ten times the frequency of the musical note. By placing a decimal point between the last two numbers, and reading the output to tenths the actual frequency readout is obtained.

When the clock pulse struck, it also put a logic zero momentarily on the P input of the lower 7474 Flip-Flop 45 while providing a momentarily overriding high input to the clear terminal of the same. This overriding high, or one, is established by coupling through the upper two 7432 OR gates 48a, 48b. At this moment Q of the lower 7474 flip-flop 45 goes high, logic one, applying a high to D of the upper flip-flop. The next rising edge of the clock of the upper flip-flop, resulting from a falling edge at the count in terminal, will drive Q inverse of the upper flip-flop low, and hence the zero set of all four 7490s (A–D) FIG. 3 in the signal counters as well as all six 7490s in the time base divider string 44. Because the count enable input holds high, the latch dump is not opened, and the display holds. The next rising clock edge at the D input of the upper flip-flop 45 resulting from the next falling edge presented at "count in" will drive the Q inverse of the upper flip-flop 45 high, thus producing a low ON THE ZERO RESET OF the four signal counting 7490s (A–D) and the six 7490s in the time base 44 causing: (1) a new count to accumulate in the four signal counting 7490's (A–D) and, (2) a ripple through count in the six time base dividers 44 which will produce a concurrence of logic ones to all inputs of the four 74H21 "And" gates in exactly 499,999.5, following cycles out of the 1 Mhz. quartz oscillator. This will produce a pulse at the output of the last 74H2 AND GATE in the cascade precisely 0.4999995 seconds after the reset hold drops, and the duration of this pulse will be precisely 0.0000005 seconds, causing the quad latches to open AT THE END OF THE IMS PULSE OR AT the expiration of the half second time period, and take any count occurring up to the ½ second point, and pass it along to the display for the next period. Thus we can see that we will at all times show on the digital display the accumulated count of frequency derived during the previous ½ second, while a new count is being taken. If no fault of lock occurs, the musical note continuing, the display will continue, being up to ½ second behind time, and showing any pitch variations.

Now let us examine what will happen if the input musical note stops or drops too low in amplitude to hold a lock in the phase lock loop circuit, or for any other reason a lock is lost, continuously or for but one cycle.

Starting, it will be assumed that no useful signal is applied to the guitar input. In this instance the "check circuit", FIG. 2, will give random varying zero and one outputs, because the D input will randomly vary between "0" and "1" at the time the clock corner hits from the VCO, there being no lock in the loop. During this condition, the numeric display will be zero.

When an adequare or useful signal is received to lock the loop, or provide a "1" at D every time a clock corner from the VCO hits, Q will hold a steady "1" so long as this condition holds, which is to say, so long as a lock holds. Now that the count enable out holds a steady "1", our having a continuous lock, the VCO holding frequency with the incoming signal, and not a single clock edge from the VCO varying more than plus or minus 90 degrees from a quadrature condition, placing the clock corner in the middle of the logic "1" from the incoming signal seen at D, Q will hold high or at "1".

As hereinabove referred to, the count enable input, FIG. 3, holds a steady logic "1", and this puts a low on the P input of the upper 7474 driving Q inverse low. This puts a low on the CLE of the lower flip-flop 45 bringing Q of the lower flip-flop 45 low, while also putting a high on all 7490 counters and dividers holding all 7490s from producing any count through. The signal count will hold zero, and no clock pulse may hit, through allowing the clock counters exposure to the clock oscillator. Because a low is on the CLE of the lower flip-flop 45, the Q output of the lower flip-flop 45 is low, driving the D of the upper flip-flop 45 low. The next rising corner on the clock input of the upper flip-flop 45 will drive Q inverse of the upper flip-flop 45 high. (Note that this rising corner of the clock input of the upper flip-flop 45 occurs at a falling corner of the data input to the 7490s which count the audio). Thus the data corner for zero reference count, the rising corner of data on the clock input of the upper flip-flop 45 drives Q inverse of said upper flip-flop high, and: (1) a low falls on all counter resets, the clock starts to count time and the data input event corners will be counted, (2) through the upper pair of OR gates 48a, 48b a high is put on the CLE of the lower flip-flop 45, and a static condition will hold in the pair of flip-flops 45. A count will be tallied and the clock will accumulate count, or time. In exactly 0.4999995 seconds the clock pulse line will run high. This will, (1) hold the quad latch open for the duration of the clock pulse, or ½ microsecond, or to exactly ½ second after the zero reference of count was established, during which time any data corners to be counted will register on the count 7490s, and dump data into the hold circuits of the quad latches, (2) a low will hit the P input of the lower flip-flop running Q of the lower flip-flop 45 high and putting a high on the D input of the upper flip-flop 45, and hence at the next data corner will drive Q inverse of the upper flip-flop low, resetting data counters and clock counters to zero and hold data count and clock time lapse measurement until the next data corner being established as time zero reference of the next count period will start the entire sequence of data accumulation for the next ½ second count accumulation.

Let us carefully examine time lapse detail, the clock has hit the P input of the lower flip-flop 45 with a low, leaving Q of the lower flip-flop 45 high. When the clock pulse dropped the count of that time was left in the display. The next rising corner at the clock input of the upper flip-flop 45 will bring Q inverse of the upper flip-flop low 20 nanoseconds thereafter. Twenty nanoseconds later, or 40 nanoseconds after the data corner hits the clock input of the upper flip-flop, or 20 nanoseconds after the clock corner hits the input of the input 7490 counter, or at the same time as the input 7490 counter could register the count, a high hits all counter resets, and zero reset occurs 20 nanoseconds thereafter. (If a data count corner has hit in the period of this 20 nanosecond window it matters not, as the reset will erase it.) As Q inverse of the upper flip-flop 45 hit low, 20 nanoseconds thereafter a low hits CLE of the lower flip-flop through the upper paid of "OR" gates, and 20 nanoseconds thereafter Q of the lower flip-flop 45 will go 1 w, driving D of the upper flip-flop low. The next data corner to the upper flip-flop 45 clock input will bring Q inverse of the upper flip-flop 45 high 20 nanoseconds thereafter. (Since the maximum frequency to be counted is audio of 20 kc or lower, the 20 nanosecond delay at getting the counter inputs low plus the 20 nanosecond delay of getting the counters out of reset, 40 nanoseconds in all will not cause a missed count, for the possibility of such would require a count frequency of 25 Mhz or higher, which is not the case of use.) We proceed to accumulate a count, noting that the clock started to count time 40 nanoseconds after the time zero mark. This delay of 40 nanoseconds to drop counters, count and clock, from reset, after the zero reference mark will result in a count of one part in twenty-five million over the correct count. This is the price paid for assurance that an extra count will not be included, and even this error associated with time delay of sequence may be removed by a slight increase in the crystal frequency over 1 Mhz, when the precise delay manitude is defined. The referred to single extra count that must be eliminated is that time zero reference data input pulse which starts the clock and count, marking time zero, must be prevented from establishing a count of one, before any time lapse.

If at any time the "check circuit" should indicate a loss of signal or loss of lock in the phase lock loop, the count enable input will drop to logic "0", a "0" is put on P of the upper 7474, 40 nanoseconds later. After an additional 60 nanoseconds, or 100 nanoseconds after the count enable line drops low, the 7490s both count and clock are locked on zero. Fifty nanoseconds after the input showed a failure of lock the quad latches were opened, thus "0.0" is displayed on the numeric display, and will continue display until a proper signal is given the instrument, and a lock is achieved in the phase lock loop. When such occurs, again we mark time zero, synchronous to the incoming wave, start the clock, enable the data counters to count, and after ½ second display frequency, showing each ½ second the frequency time integral, or actual cycle count per ½ second for the preceding half second. This display will continue so long as a suitable input signal is supplied the instrument to achieve a flawless lock.

The accuracy of the instrument will be basically the accuracy of the time base crystal, with the error of one part in twenty-five million added as is accountable for in the 40 nanosecond safety bar to counting the mark reference, plus 0.1 cycle per second because of the interval count minus one, (because the device counts discrete events and no count is given an event period until the event period has elapsed and the pulse hits).

Because much has been discussed since we last described the general performance of the instrument, we repeat the following. The instrument indicates cycles per second from a count derived during each ½ second interval, and displayed during the subsequent ½ second interval, there being a multiplication of 20 in the counted output of the VCO over the input musical sound, this occurring by division of 20 in the feedback loop of the phase lock loop, and appropriate idle frequency settings of the VCO relative to the intended input frequencies.

Figure 1:
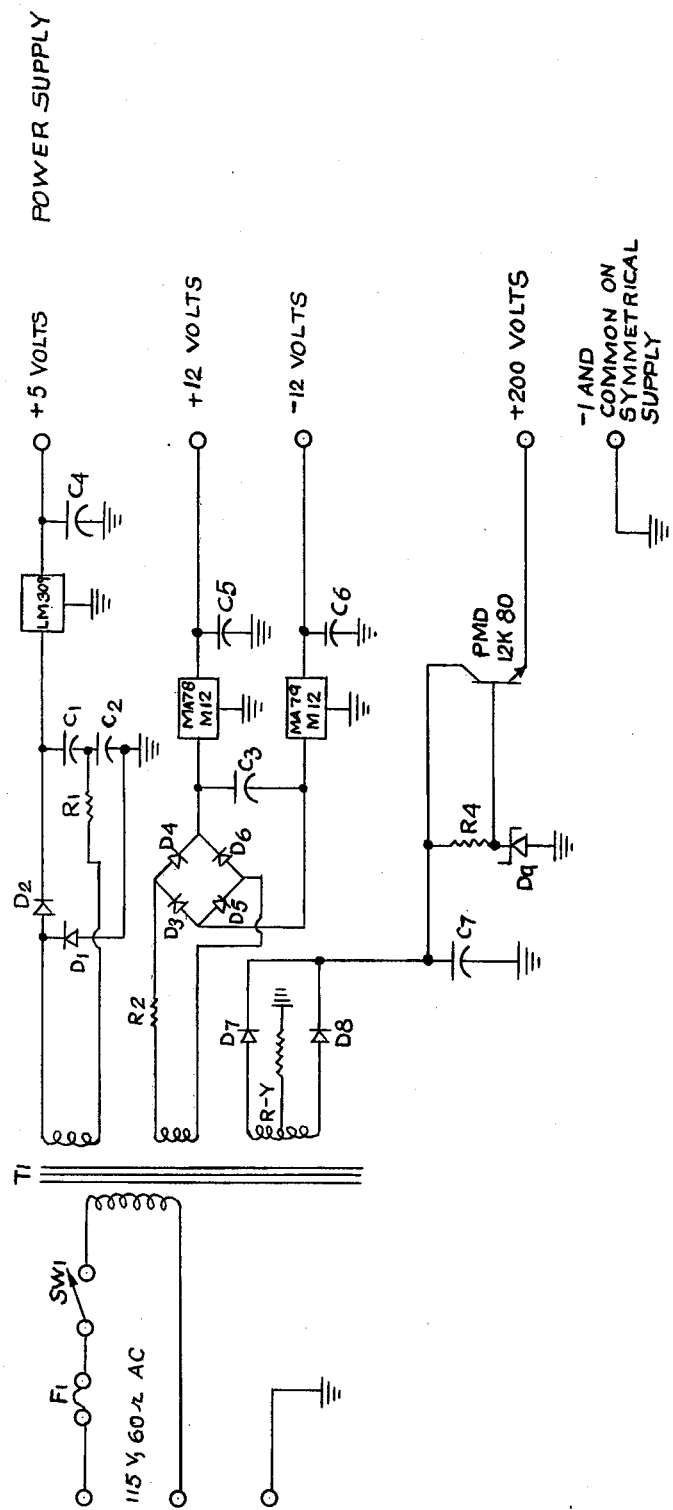
FIG. 1 is a schematic wiring diagram of the power supply used in the measuring system of the present invention.

The power supply circuits of FIG. 1 are considered self-evident and operate with the component list noted herein to provide the voltage levels as indicated. It is understood that schematics do not in cases of logic components show VCC connections, or ground connections, and in the usual cases ties of unused gate inputs to either static logic "0" or "1" levels, as is convenient or desirable in the use of specific devices.

The following component list is a definement of components and values as they appear in the schematic drawings FIGS. 1–3.

FIGURE 1 DESCRIBING THE POWER SUPPLY.

| | |
|---|---|
| $R_1$ | .33 ohm, 5 w, IRC PW5 type |
| $R_2$ | 10 ohm, 2 w |
| $R_3$ | 1200 ohm, 2 w |
| $R_4$ | .20 k ohm, ¼ w |
| $D_1$ | IN4719 diode |

-continued

| | |
|---|---|
| $D_2$ | IN4719 diode |
| $D_3$ | IN4002 diode |
| $D_4$ | IN4002 diode |
| $D_5$ | IN4002 diode |
| $D_6$ | IN4002 diode |
| $D_7$ | IN4006 diode |
| $D_8$ | IN4006 diode |
| $C_1$ | Sprague TVA, 1129.5, 5000 uf AT 10 v |
| $C_2$ | Sprague TVA, 1129.5, 5000 uf AT 10 v |
| $C_3$ | Sprague TVA, 1316, 1000 uf AT 50 v |
| $C_4$ | Sprague TVA, 1300, 1 uf AT 50 v |
| $C_5$ | Sprague TVA, 1300, 1 uf AT 50 v |
| $C_6$ | Sprague TVA, 1300 1 uf AT 50 v |
| $C_7$ | Sprague 1656 20 uf AT 400 v |
| The following are 3 terminal voltage regulators | |
| LM-309 | Regulates the 5 v supply |
| uA78M12 | (Fairchild), regulates the ±12 v side of the ±12 v dual symmetrical supply |
| uA79M12 | (Fairchild), regulates the −12 v side of the ±12 v dual symmetrical supply |
| THE FOLLOWING TRANSISTOR IS USED | |
| PMD12K80 | (Power Monolithics), a very high beta darlington regulates the 200 v supply |

FIGURE 2, Desribing Board MSC 20, The Audio AMP With AGC, Phase Lock Loop, Lock Detector, And Interfacing to TTL.

| | |
|---|---|
| $R_1$ | 47 k, ¼ w |
| $R_2$ | 10 k, ¼ w |
| $R_3$ | 10 k, ¼ w |
| $R_4$ | 10 meg, ¼ w |
| $R_5$ | 10 k, ¼ w |
| $R_6$ | 10 k, ¼ w |
| $R_7$ | 10 k, ¼ w |
| $R_8$ | 3.3 meg, ¼ w |
| $R_{10}$ | 10 k, ¼ w |
| $R_{11}$ | 47 k, ¼ w |
| $R_{12}$ | 5.1 k, ¼ w |
| $R_{13}$ | 10 k, ¼ w |
| $R_{14}$ | 10 k, ¼ w |
| $R_{15}$ | 10 k, ¼ w |
| $R_{16}$ | 10 k, ¼ w |
| $R_{17}$ | 10 k, ¼ w |
| $R_{18}$ | 30 k, ¼ w |
| $R_{19}$ | 1 k, ¼ w |
| $R_{20}$ | 1 k, ¼ w |
| $R_{21}$ | 1.3 meg, ¼ w |
| $R_{22}$ | 10 k, ¼ w |
| $R_{23}$ | 10 k, ¼ w |
| $R_{24}$ | 5.1 k, ¼ w |
| $R_{25}$ | 1 k, ¼ w |
| $R_{26}$ | 2 k, ¼ w |
| $R_{27}$ | 5.1 k, ¼ w |
| $R_{28}$ | 68 ohm, ¼ w |
| $R_{29}$ | 68 ohm, ¼ w |
| THE FOLLOWING ARE VARIABLE RESISTORS. | |
| $R_{31}$ | 5 k |
| $R_{32}$ | 5 k |
| $R_{33}$ | 5 k |
| $R_{34}$ | 10 k |
| $R_{35}$ | 10 k |
| $R_{36}$ | 20 k |
| $R_{37}$ | 1 k |
| $R_{38}$ | 2 k |
| $R_{39}$ | 20 k |
| $R_{40}$ | 20 k |
| $R_{41}$ | 20 k |
| $R_{42}$ | 10 k |
| $R_{43}$ | 10 k |
| $R_{44}$ | 10 k |
| CAPACITORS | |
| $C_1$ | 4.7 uf, 10 v |
| $C_2$ | 4.7 uf, 10 v |
| $C_3$ | 4.7 uf, 10 v |
| $C_4$ | 4.7 uf, 10 v |
| $C_5$ | 4.7 uf, 10 v |
| $C_6$ | 10 uf, 6 v |
| $C_8$ | 4.7 uf, 10 v |
| $C_9$ | .015 uf, 35 v |
| $C_{10}$ | 1000 uuf, mica |
| $C_{11}$ | .015 uf, 35 v |
| $C_{12}$ | 4.7 uf, 10 v |
| $C_{13}$ | 4.7 uf, 10 v |
| DIODES. | |
| $D_1$ | IN750A, (soft diode for AGC control) |
| $D_2$ | FD333 (Fairchild) |
| $D_3$ | FD333 |

-continued

| | |
|---|---|
| $D_4$ | FD333 |
| $D_5$ | IN758A (lo v zener) |
| $D_6$ | IN758A |
| $Sw_1$ | 12 pos, 1 pole, switch, range selector, Centralab PA070 |
| 2N3565 | Transistor, (3 are used) |
| uA741 | Monolithic op amp, (2 are used) |
| NE565 | Phase Lock Loop, (1 used) |
| 7490 | TTL counters, (2 used) (one divide by ten) (one divide by two) |
| 7474 | TTL dual D flip flop, (one used, one section only) |

FIG. 3, Describing Count Logic, Count Display, And Time Base.

| | |
|---|---|
| $R_1$ | 2.2 k, ¼ w |
| $R_2$ | 2.2 k, ¼ w |
| $R_3$ | 2.2 k, ¼ w |
| $R_4$ | 2.2 k, ¼ w |
| $R_5$ | 600 k, ¼ w |
| $R_6$ | 600 k, ¼ w |
| $R_7$ | 430 K, ¼ w |
| $R_8$ | 11 k, ¼ w |
| $R_9$ | 11 k, ¼ w |
| $R_{10}$ | 11 k, ¼ w |
| $R_{11}$ | 11 k, ¼ w |
| $C_1$ | .1 uf, 10 v |
| $C_2$ | .1 uf, 10 v |
| $C_3$ | 330 uf, 10 v |
| Quartz crystal | 1 Mhz., (one used) |
| Crystal oscillator, | (one used), DIP monolithic, TTL output, Motorola M12060P |
| Numeral Displays | (two used), dual units, each display 2 numbers Sperry or Beckman, SP 352 plus 2 CS 352 sockets |

The Following Monolithic Packages Are Used, All TTL.

| | |
|---|---|
| 7490 | (10 used), (4 as resettable counters), (five as divide by 10) (one as divide by five) |
| 7475 | (4 used), as quad latches |
| 74H21 | (2 used), as match coincidence and gate combiners in time base |
| 7474 | (1 used), dual, clocked D, settable-resettable, flip flops, used in count logic |
| 7473 | (1 used), quad nand gate, used as a driver for large load fan out |
| 7472 | (1 used), quad or gate |
| 7407 | (1 used), hex inverter |

The above comprises a complete description of components referenced in the electrical circuitry, as described in Figures #1, #2, and #3.

What is claimed is:

1. An electronic measuring system for determining the frequency of an incoming test signal of a cyclic periodic waveform and which signal may be in the audio frequency range of 0 to 20 kilocycles comprising input circuit means for receiving the test signal to be measured, voltage controller oscillator means connected in circuit with said input circuit means and responsive to said test signal to generate an oscillator output signal whose frequency is a preselected multiple of the frequency of said test signal, signal phase comparator means interconnected to said input circuit means and said oscillator means being operable to compare the phase relationship between said test signal and said oscillator output signal and to provide a phase lock of said oscillator means with the test signal, signal comparator circuit means connected between said oscillator means and said input circuit means being operable to continuously sense the phase relationship between the test signal and the oscillator ouput signal per each cycle and to provide an enabling output signal that is representative of the continuing per cycle phase relationship between said test signal and said oscillator output signal at said comparator circuit means, counter means connected in circuit with said signal comparator circuit means and said oscillator means and responsive to the presence of both said enabling signal and said oscillator output signal and if and only if there is a continuous cycle to cycle coincidence of phase between the oscillator output signal and the test signal to provide a digital count of said oscillator output signal per unit of time to be accumulated in said counter means, and said signal comparator circuit means being operable to sense a phase difference per any cycle of approximately less than one-quarter cycle between the oscillator output signal and the the test signal to enable an accumulation of a digital count that is representative of said test signal and means connected between said comparator circuit means and said counter means operable to sense a phase difference per any cycle of approximately greater than one-quarter cycle between the oscillator output signal and the test signal to automatically terminate the digital count accumulation and the display thereof.

2. An electronic measuring system as is defined in claim 1 and wherein the voltage controlled oscillator means is operable to generate an oscillator output signal whose frequency is twenty times the frequency of the test signal.

3. An electronic measuring system as defined in claim 1 and wherein the signal phase comparator means is connected to the voltage controlled oscillator and operable to provide a phase lock signal whose frequency is a sub multiple of the voltage controlled oscillator output signal.

4. An electronic measuring system as is defined in claim 3, and wherein the signal phase comparator means is operable to generate a phase lock signal whose frequency is one twentieth the frequency of the output signal of the voltage controlled oscillator.

5. An electronic measuring system as defined in claim 2 and wherein the signal phase comparator means is operable to generate a phase lock signal whose frequency is one twentieth the frequency of the output signal of the voltage controlled oscillator.

6. An electronic measuring system as defined in claim 1 and wherein attenuator means are interposed between the input circuit means and the signal phase comparator means.

7. An electronic measuring system as defined in claim 1 and wherein the counter means includes switching circuit means connected to the voltage controlled oscillator and to the signal comparator circuit means and responsive to the presence of both the enabling signal and oscillator output signal to provide a digital count of the oscillator output signal and display means in circuit with said switching means for visually displaying the digital count of said oscillator output signal per unit of time.

8. An electronic measuring system as defined in claim 7 and wherein clock means are included in the counter means operable to control the count and display of the digital count of the oscillator output signal per a predetermined unit of time.

9. An electronic measuring system as defined in claim 1 and wherein the means connected between the comparator circuit means and counter means is operable subsequent to terminating the digital count to automatically re-start the digital count upon said means again sensing a per cycle phase difference between the test signal and the oscillator output signal of approximately less than one-quarter cycle difference therebetween.

* * * * *